United States Patent

Yamaguchi et al.

[11] Patent Number: 5,966,666
[45] Date of Patent: Oct. 12, 1999

[54] MULTIPLE-BAND MOBILE TRANSCEIVER HAVING A SMALLER NUMBER OF LOCAL OSCILLATORS

[75] Inventors: Seiichi Yamaguchi; Fujio Sasaki, both of Kanagawa; Hiroaki Kosugi, Osaka, all of Japan

[73] Assignee: Matsushita Electric Industrial Co., Ltd., Osaka, Japan

[21] Appl. No.: 08/796,906

[22] Filed: Feb. 6, 1997

[30] Foreign Application Priority Data

Mar. 22, 1996 [JP] Japan .................................. 8-066056

[51] Int. Cl.⁶ .................................................. H04B 1/38
[52] U.S. Cl. .............................. 455/552; 455/76; 455/78
[58] Field of Search ................................ 455/77, 76, 78, 455/83, 552, 553, 575, 112, 86, 85, 87

[56] References Cited

U.S. PATENT DOCUMENTS

| | | | |
|---|---|---|---|
| 5,319,798 | 6/1994 | Watanabe | 455/76 |
| 5,319,799 | 6/1994 | Morita | 455/78 |
| 5,422,931 | 6/1995 | Austin-Lazarus et al. | 455/86 |
| 5,432,779 | 7/1995 | Shimo et al. | 455/86 |
| 5,519,887 | 5/1996 | Lieu | 455/266 |
| 5,564,076 | 10/1996 | Auvray | 455/76 |
| 5,727,019 | 3/1998 | Tatsumi | 455/86 |
| 5,732,330 | 3/1998 | Anderson et al. | 455/76 |
| 5,757,921 | 5/1998 | Okanobu et al. | 455/86 |

*Primary Examiner*—Reinhard J. Eisenzopf
*Assistant Examiner*—Darnell R. Armstrong
*Attorney, Agent, or Firm*—Pearne, Gordon, McCoy & Granger LLP

[57] ABSTRACT

A frequency synthesizer consists of a voltage-controlled oscillator and a frequency division and distribution section. The frequency division and distribution section, which splits an oscillation signal of the voltage-controlled oscillator into a transmission modulation local oscillation signal and a reception second local oscillation signal while frequency-dividing the oscillation signal of the voltage-controlled oscillator, includes two pairs of frequency dividers and two switches. The frequency division numbers of the two pairs of frequency dividers are so set as to accommodate all the combinations of mobile communications systems and the transmission modulation local oscillation signal/reception second local oscillation signal. The two switches are switched in accordance with a mobile communications system for which a mobile transceiver is operating. The two local oscillation signals are input to a quadrature modulator and a quadrature demodulator, respectively.

5 Claims, 3 Drawing Sheets

MULTIPLE-BAND MOBILE TRANSCEIVER HAVING A SMALLER NUMBER OF LOCAL OSCILLATORS

BACKGROUND OF THE INVENTION

1. Field of the Invention

The present invention relates to a multiple-band mobile transceiver which operates for a plurality of mobile communications systems using different radio frequency bands by switching between transmission and reception radio frequencies.

2. Description of the Related Art

FIG. 3 shows the configuration of a conceivable mobile transceiver which operates for a plurality of mobile communications systems using different radio frequency bands. Reference numeral 1 denotes an antenna; 2 and 3, duplexers corresponding to two respective radio frequency bands; 4 and 5, isolators corresponding to two respective transmission frequency bands; 6 and 7, power amplifiers corresponding to the respective transmission frequency bands; 8, a high-frequency switch; 9, a variable gain amplifier; 10, a transmission mixer; 11, a lowpass filter; 12, a variable gain amplifier; 13, a quadrature modulator; 14 and 15, lowpass filters for I and Q modulation input signals; 16 and 17, I and Q modulation input terminals; and 18, a first local oscillator. Further, reference numerals 19 and 20 denote low-noise amplifiers corresponding to two respective reception frequency bands; 21 and 22, reception mixers corresponding to the respective reception frequency bands; 23 and 24, intermediate frequency filters corresponding to two respective reception intermediate frequencies; 25, an intermediate frequency switch; 26, a variable gain amplifier; 27, a quadrature demodulator; 28 and 29, lowpass filters for I and Q demodulation outputs; 30 and 31, I and Q demodulation output terminals; 34, a local oscillator for transmission modulation; and 35, a second local oscillator for reception.

Signals that are input from the I and Q modulation input terminals 16 and 17 are modulated by the quadrature modulator 13, and then up-converted into a radio frequency by the transmission mixer 10. A resulting signal is subjected to a gain adjustment by the variable gain amplifier 9, and then input to the power amplifiers 6 or 7 selected by the high-frequency switch 8 for the transmission frequency band concerned. An output of the power amplifier 6 or 7 is passed through the isolator 4 or 5, and then input to the duplexer 2 or 3 corresponding to the radio frequency band concerned. Finally, the signal is transmitted from an antenna 1 to a radio base station as radio waves.

On the other hand, a signal transmitted from a radio base station is separated from transmission waves of the mobile transceiver by the duplexer 2 or 3 corresponding to the radio frequency band concerned, amplified by the low-noise amplifier 19 or 20 corresponding to the reception frequency band concerned, and then converted into a signal of the reception intermediate frequency concerned by the reception mixer 21 or 22. An output of the reception mixer 21 or 22 is passed through the intermediate frequency filters 23 or 24 corresponding to the reception intermediate frequency concerned, and then selected by the intermediate frequency switch 25. An output of the intermediate frequency switch 25 is subjected to a gain adjustment by the variable gain amplifier 26, and then converted into I and Q demodulation signals by the quadrature demodulator 27.

However, in the above-configured mobile transceiver, the local oscillator for transmission modulation and the second local oscillator for reception need to be provided as separate frequency synthesizers. This is disadvantageous in terms of the cost and the number of parts.

It is noted that a mobile transceiver is known in which the duplexer 3, isolator 5, power amplifier 7, high-frequency switch 8, low-noise amplifier 20, reception mixer 22, intermediate frequency filter 24, and intermediate frequency switch 25 are omitted from the multiple-band mobile transceiver of FIG. 3.

SUMMARY OF THE INVENTION

An object of the present invention is to provided a multiple-band mobile transceiver in which a local oscillator for transmission modulation and a reception second local oscillator are constituted as a single frequency synthesizer and which is therefore inexpensive and has a smaller number of parts.

To attain the above object, the invention provides a multiple-band mobile transceiver comprising a frequency division and distribution section having at least one frequency divider and at least one switch for splitting an oscillation signal of the voltage-controlled oscillator into a transmission modulation local oscillation signal and a reception second local oscillation signal while frequency-dividing the oscillation signal of the voltage-controlled oscillator, whereby a combination of a transmission modulation local oscillation signal and a reception second local oscillation signal for each of a plurality of mobile communications systems using different radio frequency bands are produced by a single frequency synthesizer.

As a result, according to the invention, a multiple-band mobile transceiver can be realized which is inexpensive and has a smaller number of parts.

DESCRIPTION OF THE PREFERRED EMBODIMENTS

Embodiments of the present invention will be hereinafter described in detail with reference to the accompanying drawings.

Embodiment 1

Figure 1:
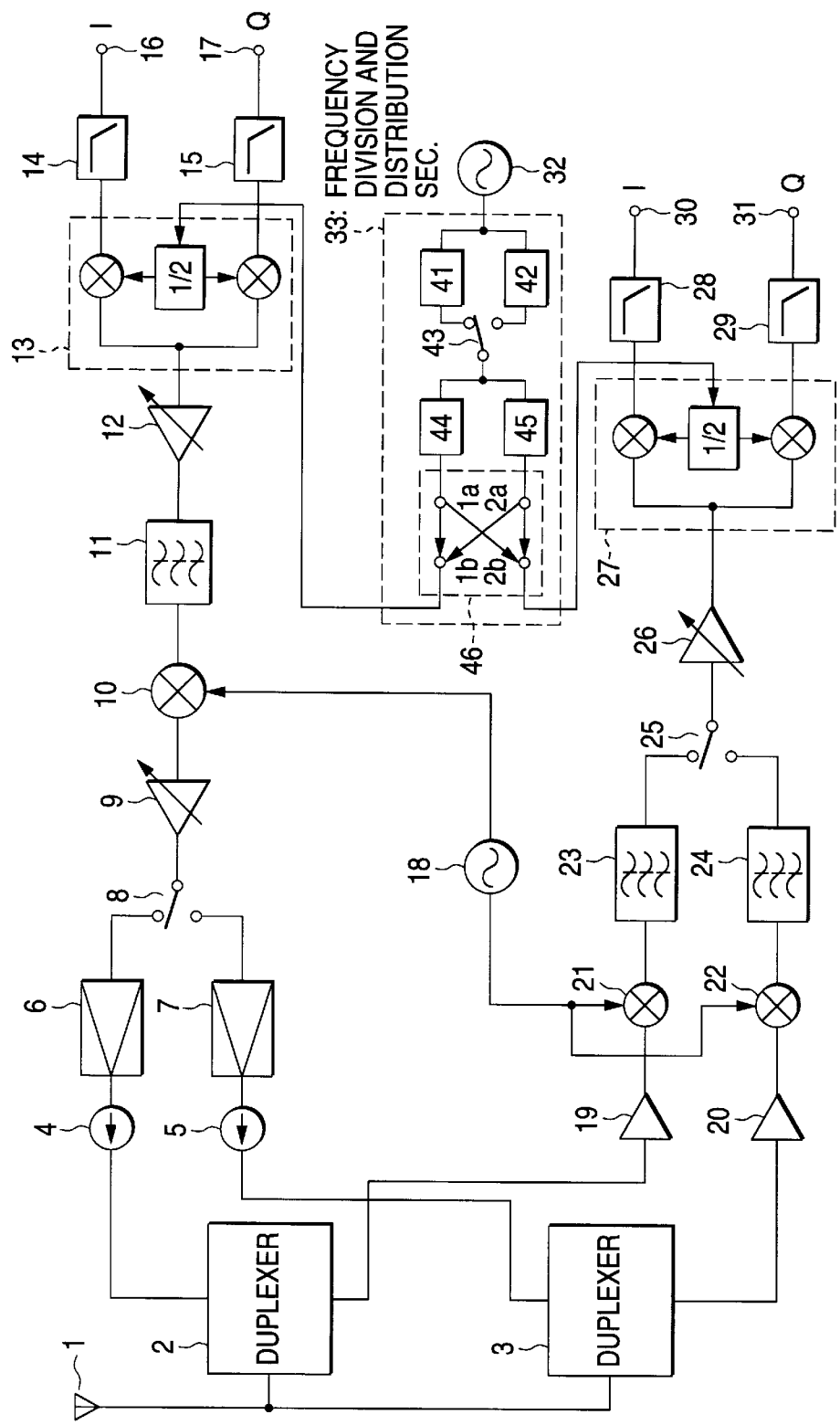
FIG. 1 is a block diagram showing the configuration of a multiple-band mobile transceiver according to a first embodiment of the present invention.

FIG. 1 shows the configuration of a multiple-band mobile transceiver according to a first embodiment of the invention. This mobile transceiver operates for two mobile communications systems A and B using different radio frequency bands A and B.

Figure 3:
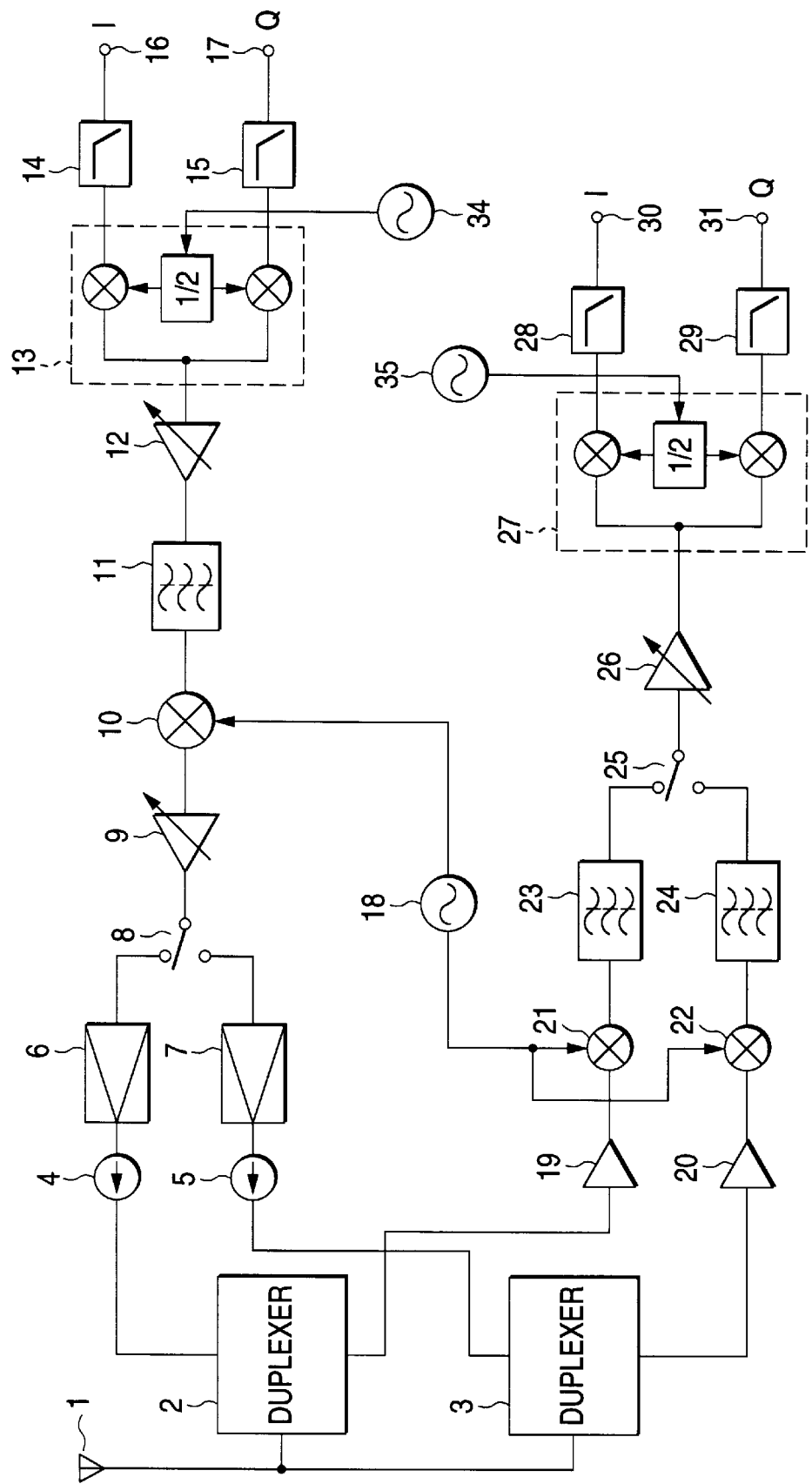
FIG. 3 is a block diagram showing the configuration of a conceivable multiple-band mobile transceiver.

In FIG. 1, the same components as in FIG. 3 are given the same reference numerals. Reference numeral 1 denotes an antenna; 2 and 3, duplexers corresponding to two respective radio frequency bands; 4 and 5, isolators corresponding to two respective transmission frequency bands; 6 and 7, power amplifiers corresponding to the respective transmission frequency bands; 8, a high-frequency switch; 9, a variable gain amplifier; 10, a transmission mixer; 11, a lowpass filter; 12, a variable gain amplifier; 13, a quadrature modulator; 14 and 15, lowpass filters for I and Q modulation input signals; 16 and 17, I and Q modulation input terminals; and 18, a first local oscillator. Further, reference numerals 19 and 20 denote low-noise amplifiers corresponding to two respective reception frequency bands; 21 and 22, reception mixers corresponding to the respective reception frequency bands; 23 and 24, intermediate frequency filters corresponding to two respective reception intermediate frequencies; 25, an intermediate frequency switch; 26, a variable gain amplifier; 27, a quadrature demodulator; 28 and 29, lowpass filters for I and Q demodulation outputs; and 30 and 31, I and Q demodulation output terminals.

Reference numeral 32 denotes a voltage-controlled oscillator, and numeral 33 denotes a frequency division and distribution section which splits an output of the voltage-controlled oscillator 32 into a transmission modulation local oscillation signal and a reception second local oscillation signal while frequency-dividing the output of the voltage-controlled oscillator 32. The frequency division and distribution section 33 consists of frequency dividers 41, 42, 44, and 45, and switches 43 and 46. The voltage-controlled oscillator 32 and the frequency division and distribution section 33 constitute a frequency synthesizer.

Next, the operation of the above-configured mobile transceiver will be described below. Signals that are input from the I and Q modulation input terminals 16 and 17 are modulated by the quadrature modulator 13, and then up-converted into a radio frequency by the transmission mixer 10. A resulting signal is subjected to a gain adjustment by the variable gain amplifier 9, and then input to the power amplifier 6 or 7 by the high-frequency switch 8 for the transmission frequency band concerned. An output of the power amplifier 6 or 7 is passed through the isolator 4 or 5, and then input to the duplexer 2 or 3 corresponding to the radio frequency band concerned. Finally, the signal is transmitted from an antenna 1 to a radio base station as radio waves.

On the other hand, a signal transmitted from a radio base station is separated from transmission waves of the mobile transceiver by the duplexer 2 or 3 corresponding to the radio frequency band concerned, amplified by the low-noise amplifier 19 or 20 corresponding to the reception frequency band concerned, and then converted into a signal of the reception intermediate frequency concerned by the reception mixer 21 or 22. An output of the reception mixer 21 or 22 is passed through the intermediate frequency filter 23 or 24 corresponding to the reception intermediate frequency concerned, and then selected by the intermediate frequency switch 25. An output of the intermediate frequency switch 25 is subjected to a gain adjustment by the variable gain amplifier 26, and then converted into I and Q demodulation signals by the quadrature demodulator 27.

The switch 43 selects the divider 41 when the mobile transceiver is operating for the mobile communications system A, and selects the divider 42 when it is operating for the mobile communications system B. Frequency division numbers corresponding to the mobile communications systems A and B are set in the dividers 41 and 42, respectively.

The switch 46, which is a 2-input/2-output composite switch, operates such that input terminals 1a and 2a are connected to output terminals 2b and 1b, respectively when the mobile transceiver is operating for the mobile communications system A, and that input terminals 1a and 2a are connected to output terminals 1b and 2b, respectively when the mobile transceiver is operating for the mobile communications system B. The frequency division number of each of the dividers 44 and 45 is so set as to correspond to a transmission modulation local oscillation signal or a reception second local oscillation signal. When the mobile transceiver is operating for the mobile communications system A, the path of the divider 44 is selected for a second local oscillation signal and the path of the divider 45 is selected for a transmission modulation local oscillation signal. Conversely, when the mobile transceiver is operating for the mobile communications system B, the path of the divider 44 is selected for a transmission modulation oscillation signal and the path of the divider 45 is selected for a reception second local oscillation signal. The frequency division numbers set in the dividers 44 and 45 are fixed.

In accordance with the mobile communications system for which the mobile transceiver is operating, an output of the voltage-controlled oscillator 32 is frequency-divided by the divider 41 or 42, and then split and supplied to the dividers 44 and 45. Finally, the composite switch 46 selects and outputs a transmission modulation local oscillation signal and a reception second local oscillation signal.

Table 1 summarizes the frequency division numbers in the frequency division and distribution section 33 to produce a transmission modulation oscillation signal and a reception second local oscillation signal for each of the mobile communications systems A and B.

TABLE 1

| Mobile communications systems | Transmission modulation local oscillation signal | Reception second local oscillation signal |
| --- | --- | --- |
| A | (Division number of divider 41) × (division number of divider 45) | (Division number of divider 41) × (division number of divider 44) |
| B | (Division number of divider 42) × (division number of divider 44) | (Division number of divider 42) × (division number of divider 45) |

The single frequency synthesizer can accommodate any combination of the mobile communications systems A and B and the above local oscillation signals if the frequency division numbers of the dividers 41, 42, 44, and 45 and the oscillation frequencies of the voltage-controlled oscillator 32 are properly set in accordance with the radio frequency bands used by the mobile communications system A and B.

For example, with an assumption that the transmission and reception central frequencies of the mobile communications system A are 1,850 MHz and 1,930 MHz, respectively and those of the mobile communications system B are 835 MHz and 880 MHz, respectively, Table 2 shows an example of a relationship among a central frequency $f_{L1}$ of the first local oscillator 18, a reception intermediate frequency $f_{IF}$ (reception second local oscillation frequency $f_{L2}$), a transmission modulation local oscillation frequency $f_{mod}$, and an oscillation frequency $f_{vco}$ of the voltage-controlled oscillator 32 for each of the mobile communications systems A and B.

TABLE 2

| Mobile communications system | $f_{L1}$ | $f_{IF}$ ($f_{L2}$) | $f_{mod}$ | $f_{vco}$ |
| --- | --- | --- | --- | --- |
| A | 1,690 MHz | 240 MHz | 160 MHz | 960 MHz |
| B | 970 MHz | 90 MHz | 135 MHz | 1,080 MHz |

The above frequency relationship can be satisfied by setting the frequency division numbers of the dividers 41, 42, 44, and 45 as shown in Table 3.

TABLE 3

|  | Divider 41 | Divider 42 | Divider 44 | Divider 45 |
|---|---|---|---|---|
| Division number | 1 | 1/2 | 1/2 | 1/3 |

As for the frequency relationship of Table 2, the frequencies of a transmission modulation local oscillation signal and a reception second local oscillation signal as outputs of the frequency division and distribution section 33 are twice the frequencies $f_{mod}$ and $f_{L2}$, respectively. This is because a ½ frequency divider is provided in each of the quadrature modulator 13 and the quadrature demodulator 27. If I and Q signals are baseband-detected by the quadrature demodulator 27, the reception intermediate frequency $f_{IF}$ and the reception second local oscillation frequency $f_{L2}$ are identical.

It is noted that the frequency relationship of Table 2 is just an example. Where the frequency division numbers of the respective dividers are set as shown in Table 3, it suffices that the reception intermediate frequency $f_{IF}$ and the transmission modulation local oscillation frequency $f_{mod}$ for the mobile communications system A have a ratio 3:2, and that the reception intermediate frequency $f_{IF}$ and the transmission modulation local oscillation frequency $f_{mod}$ for the mobile communications system B have a ratio 2:3. In actual designing of a mobile transceiver, it is necessary to determine the internal frequency relationship so as to prevent self spurious frequencies from falling within the reception band and transmission spurious frequencies from existing in the vicinity of the transmission band. It can be said that in the invention the degree of freedom of frequency selection is sufficiently high to satisfy such requirements.

Since the oscillation frequencies of the voltage-controlled oscillator 32 corresponding to the mobile communications systems A and B are 960 MHz and 1,080 MHz, respectively, it suffices that the voltage-controlled oscillator 32 have a frequency variable range of about 150 MHz. Even in a case where the voltage-controlled oscillator 32 operates at 3 V, the sensitivity of a variable capacitance diode may be set at about 50 MHz/V; it is possible to implement such a circuit configuration. Where the voltage-controlled oscillator 32 operates a 5 V, the sensitivity of the variable capacitance diode may be set at about 30 MHz/V. However, where the voltage range of the voltage-controlled oscillator 32 is required to be lower than 3 V, it may be necessary to provide, for instance, a means for switching the capacitance of a resonance circuit.

In the above embodiment, the dividers 41, 42, 44, and 45 are separate elements having fixed frequency division numbers. This configuration may be modified such that the dividers 41 and 42 are implemented by a single element whose frequency division number is switched in accordance with the mobile communications system for which the mobile transceiver is operating, and/or that the dividers 44 and 45 are implemented by a single element whose frequency division number is switched in a time-divisional manner. Because most of TDMA mobile communications systems allocate different time slots to transmission and reception, a single divider may be provided which is switched in a time-divisional manner for transmission and reception. As a further alternative, even a single element whose frequency division number is switched in a time-divisional manner may be provided instead of the dividers 41, 42, 44, and 45, with the switch 43 omitted.

Embodiment 2

Figure 2:
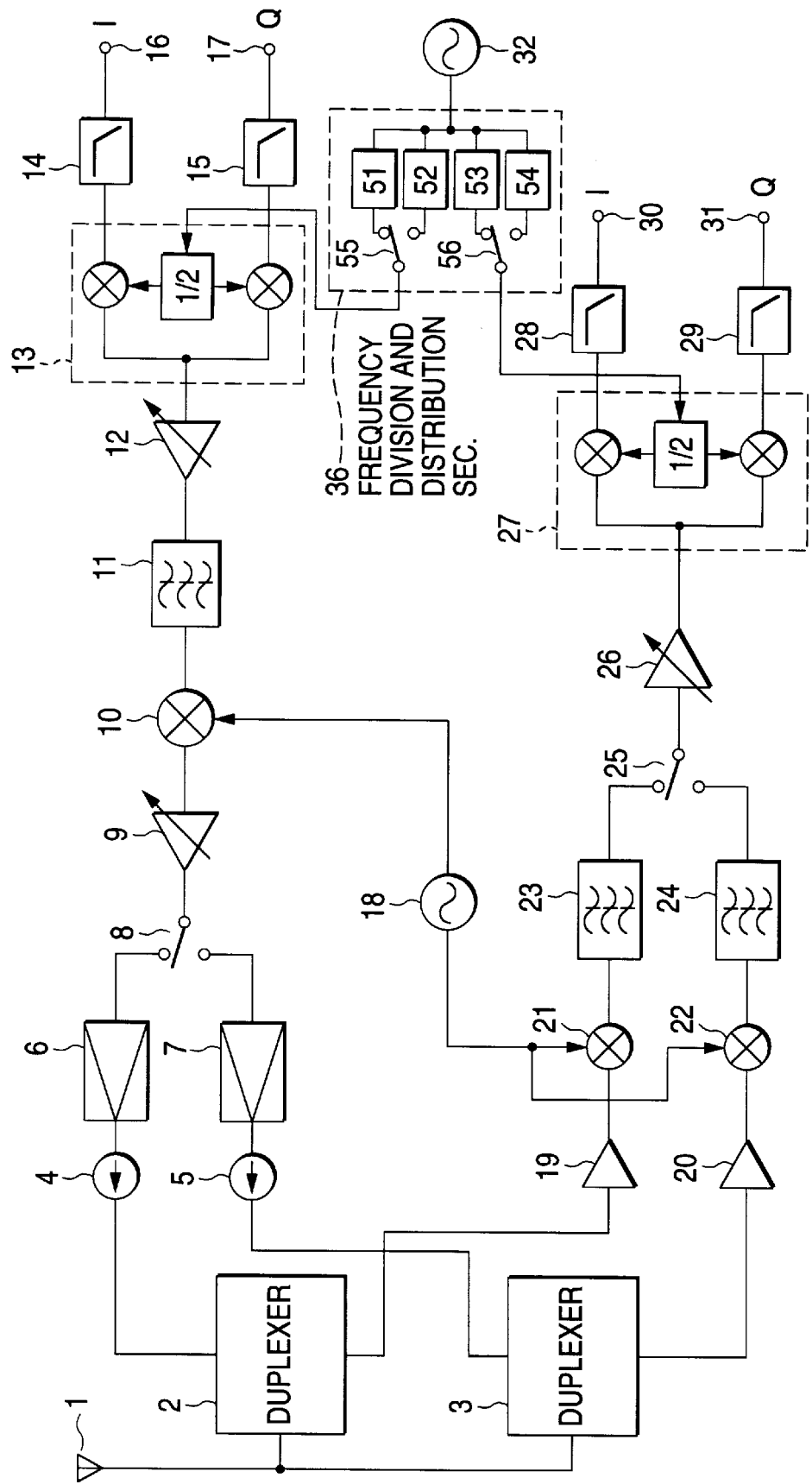
FIG. 2 is a block diagram showing the configuration of a multiple-band mobile transceiver according to a second embodiment of the invention.

FIG. 2 shows the configuration of a multiple-band mobile transceiver according to a second embodiment of the invention. Also in this embodiment, the mobile transceiver operates for two mobile communications systems A and B using different radio frequency bands A and B.

The configuration of FIG. 2 other than a frequency division and distribution section 36 is the same as that of FIG. 1. A voltage-controlled oscillator 32 and the frequency division and distribution section 36 constitute a frequency synthesizer. The frequency division and distribution section 36 consists of frequency dividers 51–54 which have frequency division numbers accommodating all the combinations (4 kinds) of the mobile communications systems A and B and the transmission modulation local oscillation signal/reception second local oscillation signal, and switches 55 and 56 that are switched in accordance with the mobile communications system for which the mobile transceiver is operating.

A frequency division number corresponding to the mobile communications system A and the transmission modulation local oscillation signal is set in the divider 51. A frequency division number corresponding to the mobile communications system B and the transmission modulation local oscillation signal is set in the divider 52. A frequency division number corresponding to the mobile communications system A and the reception second local oscillation signal is set in the divider 53. A frequency division number corresponding to the mobile communications system B and the reception second local oscillation signal is set in the divider 54. The switch 55 selects the divider 51 when the mobile transceiver is operating for the mobile communications system A, and selects the divider 52 when the mobile transceiver is operating for the mobile communications system B. The switch 56 selects the divider 53 when the mobile transceiver is operating for the mobile communications system A, and selects the divider 54 when the mobile transceiver is operating for the mobile communications system B.

An output signal of the voltage-controlled oscillator 32 is split and supplied to the dividers 51–54. The number of dividers is equal to the number of all the combinations (4 kinds) of the mobile communications systems (two) and the transmission modulation local oscillation signal/reception second local oscillation signal. When the mobile transceiver is operating for the mobile communications system A, the switches 55 and 56 select the path of the divider 51 for the transmission modulation local oscillation signal and select the path of the divider 53 for the reception second local oscillation signal. Similarly, when the mobile transceiver is operating for the mobile communications system B, the switches 55 and 56 select the path of the divider 52 for the transmission modulation local oscillation signal and select the path of the divider 54 for the reception second local oscillation signal.

The example of the frequency relationship mentioned in the first embodiment is satisfied by setting the frequency division numbers of the dividers 51–54 as shown in Table 4.

TABLE 4

|  | Divider 51 | Divider 52 | Divider 53 | Divider 54 |
|---|---|---|---|---|
| Division number | 1/3 | 1/4 | 1/2 | 1/6 |

As described above, according to the invention, in a multiple-band mobile transceiver which operates for a plurality of mobile communications systems using different radio frequency bands, an output of the frequency division and distribution section is split into a transmission modulation local oscillation signal and a reception second local oscillation signal while being frequency-divided at proper dividing ratios, whereby a single frequency synthesizer can provide both of the transmission modulation local oscillation signal and the reception second local oscillation signal for each mobile communications system. As a result, there can be obtained a multiple-band mobile transceiver which is inexpensive and has a smaller number of parts.

What is claimed is:

1. A mobile transceiver which operates in a plurality of radio frequency bands for each of transmission and reception by switching among different radio frequency bands used by a plurality of mobile communications systems, the mobile transceiver comprising:

a single voltage-controlled oscillator for producing an oscillation signal having a selected one of frequencies that correspond to the plurality of mobile communications systems; and a frequency division and distribution section which receives an output oscillation signal of the voltage-controlled oscillator, said frequency division and distribution section splitting the oscillation signal of the voltage-controlled oscillator into a transmission-side local oscillation signal and a reception-side local oscillation signal while frequency dividing the oscillation signal of the voltage-controlled oscillator, the frequency division and distribution section comprising:

at least one frequency divider for providing division numbers for accommodating all combinations of the plurality of mobile communications systems and the transmission-side local oscillation signal and the reception side local oscillation signal; and at least one switch that is switched in accordance with a selected one of the plurality of mobile communications systems.

2. The mobile transceiver according to claim 1, wherein the at least one frequency divider provides division numbers corresponding to the plurality of mobile communications systems and/or the transmission-side local oscillation signal and the reception-side local oscillation signal.

3. The mobile transceiver according to claim 1, wherein the at least one frequency divider is a single frequency divider having a division number that is switched for the plurality of mobile communications systems, and is further switched for the transmission-side local oscillation signal and the reception-side local oscillation signal in a time-divisional manner.

4. A mobile transceiver which operates in a plurality of radio frequency bands for each of transmission and reception by switching among different radio frequency bands used by a plurality of mobile communications systems, the mobile transceiver comprising:

a single voltage-controlled oscillator for producing an oscillation signal having a selected one of frequencies that correspond to the plurality of mobile communications systems; and a frequency division and distribution section comprising:

a first group of frequency dividers connected to an output of the voltage-controlled oscillator and having division numbers that are predetermined for the plurality of mobile communications systems;

a first switch for switching among output signals of the frequency dividers of the first group in accordance with a selected one of the plurality of mobile communications systems;

a second group of frequency dividers connected to the first switch and having division numbers that are predetermined in accordance with combinations of the plurality of mobile communications systems and the transmission-side local oscillation signal and the reception-side local oscillation signal; and a second switch for distributing, in accordance with the selected mobile communications system, output signals of the second group of frequency dividers so that said output signals of said second group of frequency dividers serve as a transmission-side local oscillation signal and a reception-side local oscillation signal.

5. A mobile transceiver which operates in a plurality of radio frequency bands for each of transmission and reception by switching among different radio frequency bands used by a plurality of mobile communications systems, the mobile transceiver comprising:

a single voltage-controlled oscillator for producing an oscillation signal having a selected one of frequencies that correspond to the plurality of mobile communications systems; and a frequency division and distribution section comprising:

frequency dividers connected to an output of the voltage-controlled oscillator and provided in a number equal to the number of all combinations of the plurality of mobile communications systems and the transmission-side local oscillation signal and the reception-side local oscillation signal, the frequency dividers having division numbers that are predetermined for the respective combinations; and at least one switch for selecting and distributing part of output signals of the frequency dividers for selected combinations of the plurality of mobile communications systems and a transmission-side local oscillation signal and a reception-side local oscillation signal.

* * * * *

UNITED STATES PATENT AND TRADEMARK OFFICE
CERTIFICATE OF CORRECTION

PATENT NO.   : 5,966,666
DATED        : October 12, 1999
INVENTOR(S)  : Yamaguchi et al.

It is certified that error appears in the above-indentified patent and that said Letters Patent is hereby corrected as shown below:

Column 3, Line 27, delete "by  the" and insert --by the--.

Column 7, Line 30, Claim 1 (Line 21), delete "systems and" and insert --systems,--.

Column 7, Line 31, Claim 1 (Line 22), after "signal" insert --,-- (comma).

Column 7, Line 32, Claim 1 (Line 23), delete "reception side" and insert --reception-side--.

Signed and Sealed this

Twenty-fifth Day of July, 2000

Attest:

Q. TODD DICKINSON

*Attesting Officer*            *Director of Patents and Trademarks*